(12) United States Patent
Uchida

(10) Patent No.: US 6,229,175 B1
(45) Date of Patent: May 8, 2001

(54) NONVOLATILE MEMORY

(75) Inventor: Hidetsugu Uchida, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/272,313

(22) Filed: Mar. 19, 1999

(30) Foreign Application Priority Data

Mar. 23, 1998 (JP) .................................................. 10-074715

(51) Int. Cl.[7] .................................................. H01L 29/788
(52) U.S. Cl. ........................ 257/315; 257/316; 257/317; 257/318; 257/298; 257/320; 257/321
(58) Field of Search .................................... 257/315, 316, 257/317, 318, 298, 320, 321

(56) References Cited

U.S. PATENT DOCUMENTS

| | | | | |
|---|---|---|---|---|
| 5,619,051 | * | 4/1997 | Endo | 257/316 |
| 5,650,648 | * | 7/1997 | Kapoor | 257/316 |
| 5,708,285 | * | 1/1998 | Otani et al. | 257/315 |
| 5,798,548 | * | 8/1998 | Fujiwara | 257/319 |
| 5,847,427 | * | 12/1998 | Hagiwara | 257/324 |

* cited by examiner

Primary Examiner—Edward Wojciechowicz
(74) Attorney, Agent, or Firm—Jones Volentine, L.L.C.

(57) ABSTRACT

A nonvolatile memory includes a charge transfer layer, having a low barrier height, between the floating gate electrode and the control gate electrode. Accordingly, the nonvolatile memory avoids the problem in which the number of program and erasure cycles is decreased as a result of degradation of a tunnel oxide film.

17 Claims, 14 Drawing Sheets

NONVOLATILE MEMORY

BACKGROUND OF THE INVENTION

1. Field of the invention

The present invention generally relates to a nonvolatile memory and method of forming the same, and more particularly, the present invention relates to a flash memory and a method of forming the same.

This application is a counterpart of Japanese application Ser. No. 074715/1998, filed Mar. 23, 1998, the subject matter of which is incorporated herein by reference.

2. Description of the Related Art

FIG. 1 is a cross sectional view showing a conventional flash memory cell. As shown in FIG. 1, the conventional flash memory cell includes a stacked layer structure which comprises a control gate electrode 6, an insulating film 5, a floating gate electrode 4, and a tunnel oxide film 3 on a p type semiconductor substrate 10 having an $n^+$ type source region 1, an $n^+$ type source region 7, an $n^+$ type drain region 2, a $p^+$ type drain region 8. The flash memory cell has a structure which is similar to that of an EPROM (Erasable Programmable Read Only Memory). However, in the conventional flash memory cell, the tunnel oxide film 3, having a thickness of about 10 nm, is formed instead of a gate oxide film as in an EPROM. The $n^+$ type source region 7 is formed under the $n^+$ type source region 1 to prevent a tunnel leakage between bands. On the other hand, the $p^+$ type drain region 8 is formed under the $n^+$ type drain region 2 to achieve programming efficiency.

The program (write) operation is performed by injecting electrons from the $n^+$ type drain region 2 to the floating gate electrode 4. Therefore, when predetermined voltages, for example 10V, 5V, 0V, are applied to the control gate electrode 6, the $n^+$ type drain region 2, and the $n^+$ type source region 1, hot electrons occur near the $n^+$ type drain region 2, and as a result the hot electrons are injected into the floating gate electrode 4. Therefore, the memory cell becomes the condition ("0") that a threshold voltage is a high.

On the other hand, the erase operation is performed by emitting the electrons in the floating gate electrode 4 into the $n^+$ type source region 1 via the tunnel oxide film 3. FIG. 2 is a schematic energy band diagram of a conventional flash memory cell in the erase operation. As shown in FIG. 2, the erase operation is performed by applying a high voltage to the tunnel oxide film 3, emitting the electrons stored in the floating gate electrode 4 by tunneling, and forming the condition ("1") that a threshold voltage is low. More specifically, the erase operation is performed by applying −10V and 5V to the control gate electrode 6 and the $n^+$ type source region 1, respectively, while opening the $n^+$ type drain region 2.

Further, the read operation is performed as follows. By respectively applying 1V, 5V and 0V to the control gate electrode 6, the $n^+$ type drain region 2, and the $n^+$ type source region 1, a memory cell is selected, as a result the condition of the threshold voltage of the memory cell is detected.

The conventional flash memory has disclosed in "Semiconductor World, April 1991, pp. 94–98".

In the conventional nonvolatile memory, it is desirable to prevent a situation in which the number of program and erasure cycles is decreased by a degradation of the tunnel oxide film.

SUMMARY OF THE INVENTION

An object of the present invention is to provide a nonvolatile memory that can avoid the problem in which the number of program and erasure cycles is decreased as a result of degradation of the tunnel oxide film.

According to one aspect of the present invention, for achieving the above object, there is provided a nonvolatile memory having a floating gate electrode, a control gate electrode, a tunnel oxide film between the floating gate electrode and a semiconductor substrate, and a first insulating film between the control gate electrode and the floating gate electrode, comprising: a second insulating film which is sandwiched between the control gate electrode and the floating gate electrode, the second insulating film having a barrier height which is lower than a barrier height of the first insulating film.

According to another aspect of the present invention, for achieving the above object, there is provided a nonvolatile memory having a first floating gate electrode, a control gate electrode, a tunnel oxide film between the first floating gate electrode and a semiconductor substrate, and a first insulating film between the control gate electrode and the first floating gate electrode, comprising: a second floating gate electrode which is sandwiched between the control gate electrode and the first floating gate electrode; a second insulating film which is sandwiched between the control gate electrode and the second floating gate electrode; and a third insulating film which is sandwiched between the first and second floating gate electrodes; wherein the second and third insulating films have a combined thickness which is less than a thickness of the first insulating film.

According to another aspect of the present invention, for achieving the above object, there is provided a nonvolatile memory having a first floating gate electrode, a control gate electrode, a tunnel oxide film between the floating gate electrode and a semiconductor substrate, and a first insulating film between the control gate electrode and the first floating gate electrode, comprising: a second floating gate electrode which is sandwiched between the control gate electrode and the first floating gate electrode; a second insulating film which is sandwiched between the control gate electrode and the second floating gate electrode; and a multiple layer structure which is sandwiched between the first and second floating gate electrodes, the multiple layer structure comprising third and fourth insulating layers, the third and fourth insulating layers having different barrier heights, respectively.

According to another aspect of the present invention, for achieving the above object, there is provided a nonvolatile memory having a first floating gate electrode, a control gate electrode, a tunnel oxide film between the floating gate electrode and a semiconductor substrate, and a first insulating film between the control gate electrode and the first floating gate electrode, comprising: a second floating gate electrode which is sandwiched between the control gate electrode and the first floating gate electrode; a second insulating film which is sandwiched between the first and second floating gate electrodes; and a multiple layer structure which is sandwiched between the control gate electrode and the second floating gate electrode, the multiple layer structure comprising third and fourth insulating layers, the third and fourth insulating layers having different barrier heights, respectively.

According to another aspect of the present invention, for achieving the above object, there is provided a nonvolatile memory having a first floating gate electrode, a control gate electrode, a tunnel oxide film between the floating gate electrode and a semiconductor substrate, and a first insulating film between the control gate electrode and the first floating gate electrode, comprising: a second floating gate electrode which is sandwiched between the control gate electrode and the first floating gate electrode; a first multiple layer structure which is sandwiched between the first and second floating gate electrodes, the first multiple layer structure comprising second and third insulating layers, the second and third insulating layers having different barrier heights, respectively; and a second multiple layer structure which is sandwiched between the control gate electrode and the second floating gate electrode, the second multiple layer structure comprising fourth and fifth insulating layers, the fourth and fifth insulating layers having different barrier heights, respectively.

According to another aspect of the present invention, for achieving the above object, there is provided a nonvolatile memory having a first floating gate electrode, a control gate electrode, a tunnel oxide film between the floating gate electrode and a semiconductor substrate, and a first insulating film between the control gate electrode and the first floating gate electrode, comprising: a second floating gate electrode which is sandwiched between the control gate electrode and the first floating gate electrode; a second insulating film which is sandwiched between the control gate electrode and the second floating gate electrode; and a multiple layer structure which is sandwiched between the first and second floating gate electrodes, the multiple layer structure including alternatively formed conductive layers and third insulating layers.

According to another aspect of the present invention, for achieving the above object, there is provided a nonvolatile memory having a first floating gate electrode, a control gate electrode, a tunnel oxide film between the floating gate electrode and a semiconductor substrate, and a first insulating film between the control gate electrode and the first floating gate electrode, comprising: a second floating gate electrode which is sandwiched between the control gate electrode and the first floating gate electrode; a second insulating film which is sandwiched between the first and second floating gate electrodes, and a multiple layer structure which is sandwiched between the control gate electrode and the second floating gate electrode, the multiple layer structure including alternatively formed conductive layers and third insulating layers.

According to another aspect of the present invention, for achieving the above object, there is provided a nonvolatile memory having a first floating gate electrode, a control gate electrode, a tunnel oxide film between the floating gate electrode and a semiconductor substrate, and a first insulating film between the control gate electrode and the first floating gate electrode, comprising; a second floating gate electrode which is sandwiched between the control gate electrode and the first floating gate electrode; a first multiple layer structure which is sandwiched between the first and second floating gate electrodes, the first multiple layer structure including alternatively formed first conductive layers and third insulating layers; and a second multiple layer structure which is sandwiched between the control gate electrode and the second floating gate electrode, the second multiple layer structure including alternatively formed second conductive layers and fourth insulating layers.

According to another aspect of the present invention, for achieving the above object, there is provided a nonvolatile memory having a floating gate electrode, a control gate electrode, a tunnel oxide film between the floating gate electrode and a semiconductor substrate, and a first insulating film between the control gate electrode and the floating gate electrode, comprising: second and third insulating films which are alternatively formed so as to be sandwiched between the control gate electrode and the floating gate electrode, the second and third insulating films having different barrier heights, respectively.

According to another aspect of the present invention, for achieving the above object, there is provided a nonvolatile memory having a floating gate electrode, a control gate electrode, a tunnel oxide film between the floating gate electrode and a semiconductor substrate, and a first insulating film between the control gate electrode and the floating gate electrode, comprising: second and third insulating films which are alternatively formed so as to be sandwiched between the control gate electrode and the floating gate electrode, the second and third insulating films having different barrier heights, respectively; and fourth and fifth insulating films which are alternatively formed so as to be sandwiched between the control gate electrode and the floating gate electrode, the fourth and fifth insulating films having different barrier heights, respectively.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A nonvolatile memory according to a first preferred embodiment of the present invention will hereinafter be described in detail with reference to the accompanying drawings.

Figure 1:
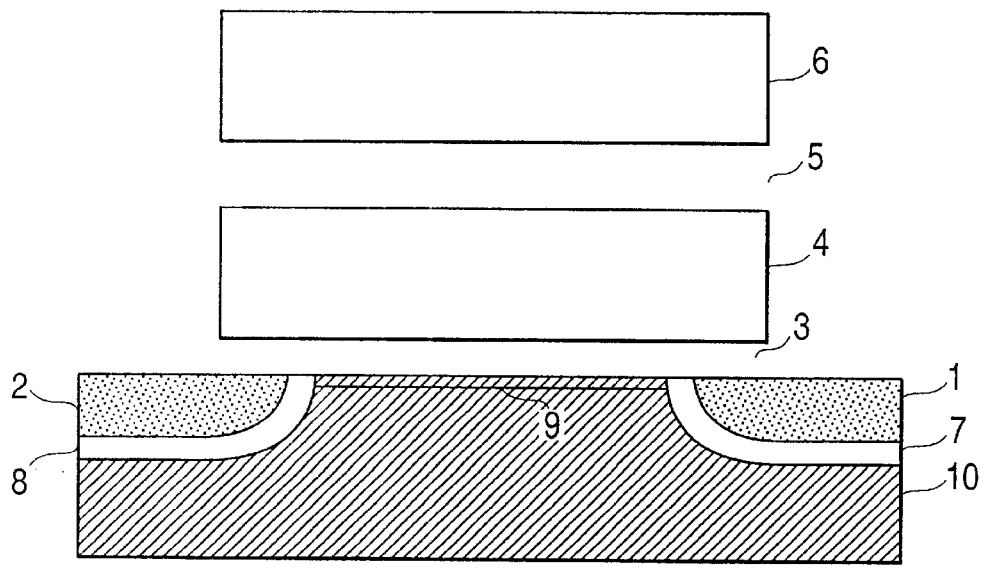
FIG. 1 is a cross sectional view showing a conventional flash memory cell.
Figure 2:
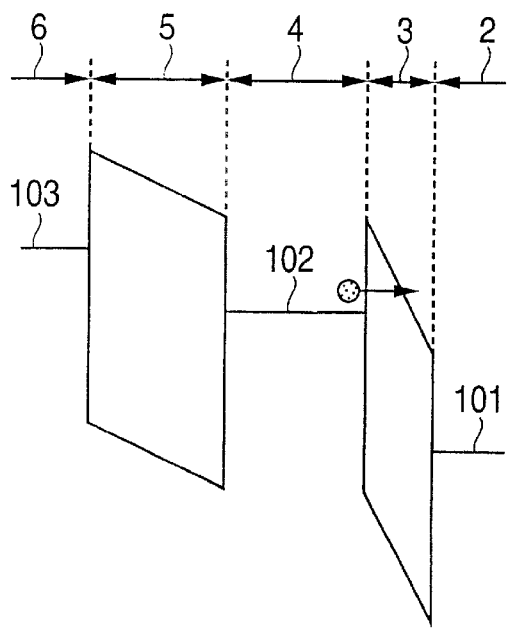
FIG. 2 is a schematic energy band diagram of a conventional flash memory cell in an erase operation.
Figure 3:
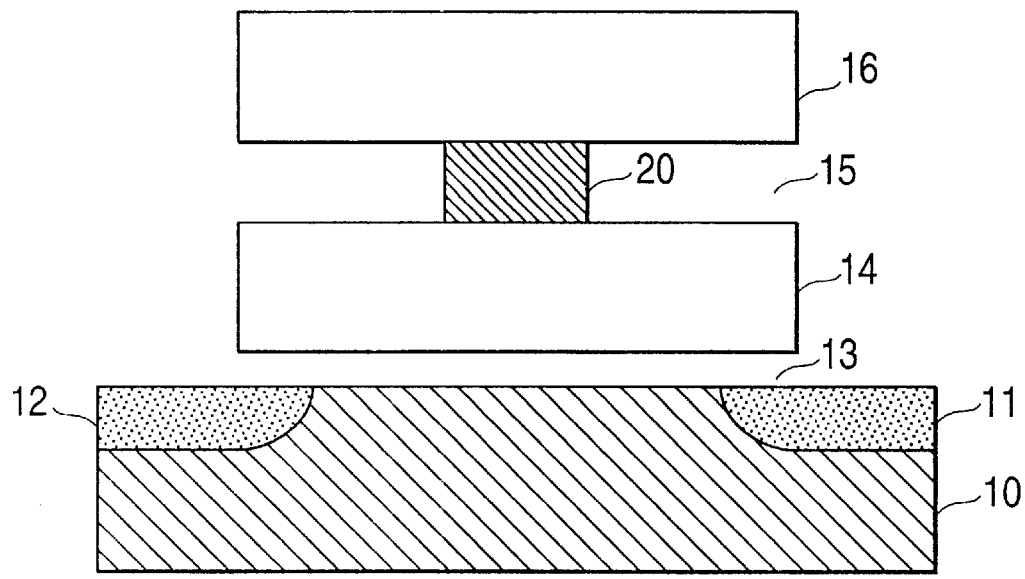
FIG. 3 is a cross-sectional view showing a nonvolatile memory according to a first preferred embodiment of the present invention.

FIG. 3 is a cross-sectional view showing a nonvolatile memory according to a first preferred embodiment of the present invention.

As shown in FIG. 3, a nonvolatile memory according to a first preferred embodiment of the present invention, which preferably includes a floating gate electrode 14, a control gate electrode 16, a tunnel oxide film 13 between the floating gate electrode 14 and a semiconductor substrate 10 having a source region 11 and a drain region 12 on a surface, and a first insulating film 15 between the control gate electrode 16 and the floating gate electrode 14. Further, the nonvolatile memory of the first preferred embodiment preferably includes a second insulating film 20 which is sandwiched between the control gate electrode 16 and the floating gate electrode 14, the second insulating film 20 has a barrier height which is lower than that of the first insulating film 15. The second insulating film 20 serves as a charge transfer layer. For example, the semiconductor substrate 10 is a p-type silicon substrate, the source and drain regions 11, 12 are formed by ion-implanting Arsenic (As) into the semiconductor substrate 10, each of the tunnel oxide film 13 and the first insulating film 15 is a silicon oxide film, and the floating gate electrode 14 and the control gate electrode 16 are a polysilicon. As already mentioned, the second insulating film 20 has a barrier height which is lower than that of the first insulating film 15. A low barrier height means that electrons are discharged by a low electric field. The second insulating film 20 is made of a material in which electrons in the floating gate electrode 14 are discharged to the control gate electrode 16 via the second insulating film 20, The nonvolatile memory is erased by applying a negative voltage to the semiconductor substrate 10 and by applying a positive voltage to the control gate electrode 16.

As mentioned above, since the nonvolatile memory of the first preferred embodiment provides the charge transfer layer, having a low barrier height, between the floating gate electrode 14 and the control gate electrode 16, the electrons in the floating gate electrode 14 are drawn to the control gate electrode 16 via the charge transfer layer at the erasure cycle. As a result, the electrons does not flow in the tunnel oxide film 13. Therefore, the tunnel oxide film 13 does not degrade. Accordingly, the nonvolatile memory of the first preferred embodiment avoids the problem in which the number of program and erasure cycles is decreased as a result of degradation the tunnel oxide film.

Figure 4:
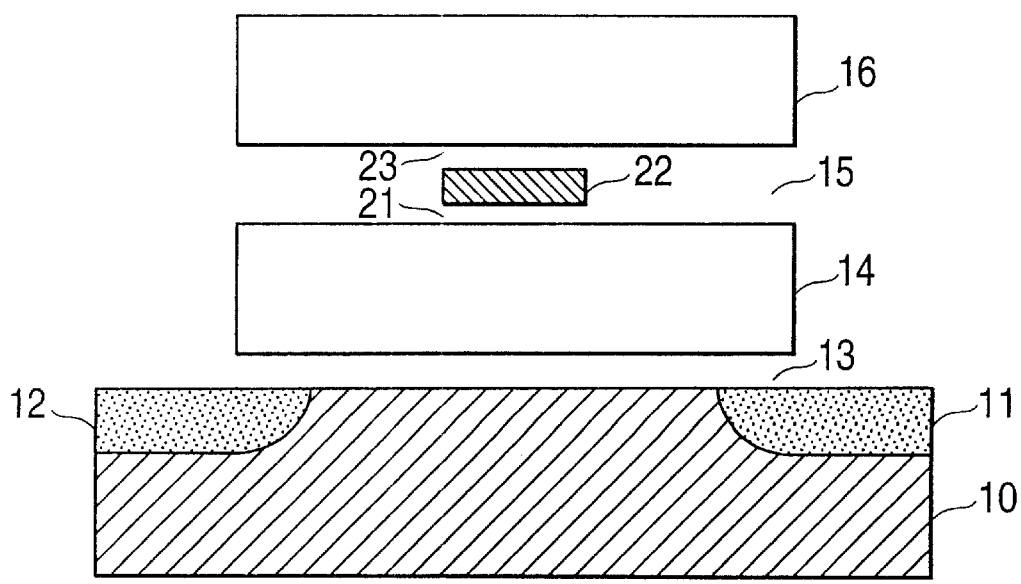
FIG. 4 is a cross-sectional view showing a nonvolatile memory according to a second preferred embodiment of the present invention.

FIG. 4 is a cross-sectional view showing a nonvolatile memory according to a second preferred embodiment of the present invention.

As shown in FIG. 4, the nonvolatile memory according to a second preferred embodiment of the present invention is preferably made up of a first floating gate electrode 14, a control gate electrode 16, a tunnel oxide film 13 between the first floating gate electrode 14 and a semiconductor substrate 10, and a first insulating film 15 between the control gate electrode 16 and the first floating gate electrode 14. Further, the nonvolatile memory of the second preferred embodiment preferably includes a second floating gate electrode 22 which is sandwiched between the control gate electrode 16 and the first floating gate electrode 14, a second insulating film 21 which is sandwiched between the first floating gate electrode 14 and the second floating gate electrode 22, a third insulating film 23 which is sandwiched between the second floating gate electrode 22 and the control gate electrode 16. The second and third insulating films 21, 23 have a combined thickness which is less than that of the first insulating film 15. For example, the semiconductor substrate 10 is a p-type silicon substrate, the source and drain regions 11, 12 are formed by ion-implanting Arsenic (As) into the semiconductor substrate, the tunnel oxide film 13 and the first, second and third insulating films 15, 21, 23 are a silicon oxide film, and the first and second floating gate electrodes 14, 22 and the control gate electrode 16 are a polysilicon.

Figure 5:
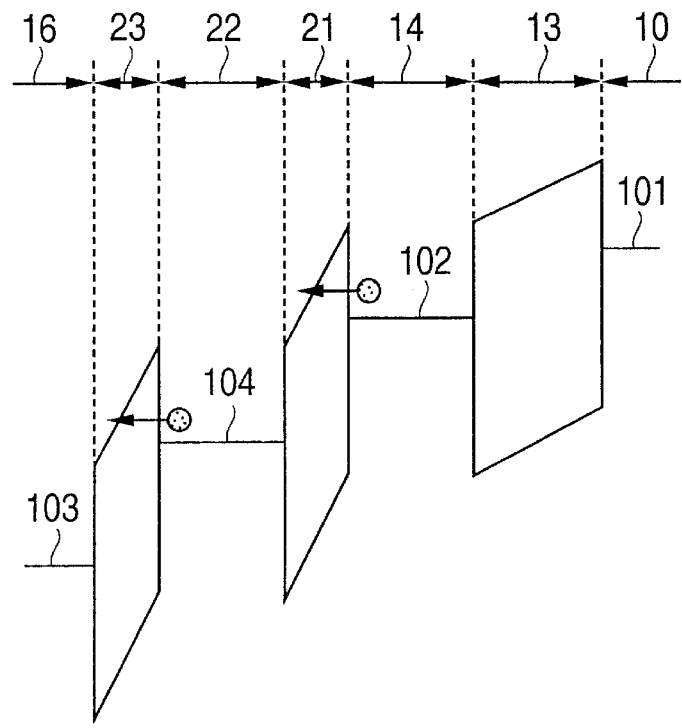
FIG. 5 is a schematic energy band diagram in an erase operation of a nonvolatile memory according to a second preferred embodiment.

FIG. 5 is a schematic energy band diagram of a nonvolatile memory according to a second preferred embodiment in the erase operation. The nonvolatile memory is erased by applying a negative voltage to the semiconductor substrate 10 and by applying a positive voltage to the control gate electrode 16. At this time, since the second and third insulating films 21, 23 which have a combined thickness which is less than that of the first insulating film 15, an electric field is applied to the second and third insulating films 21, 23. Therefore, as shown in FIG. 5, tunneling occurs in the second and third insulating films 21, 23. As a result, the electrons in the first floating gate electrode 14 are drawn to the control gate electrode 16.

As mentioned above, since the nonvolatile memory of the second preferred embodiment provides the second floating gate electrode 22 between the first floating gate electrode 14 and the control gate electrode 16, the electrons in the first floating gate electrode 14 are drawn to the control gate electrode 16 via the second floating gate electrode 22 at the erasure cycle. As a result, the electrons do not flow in the tunnel oxide film 13. Therefore, the tunnel oxide film 13 does not degrade. Accordingly, the nonvolatile memory of the second preferred embodiment avoids the problem in which the number of program and erasure cycles is decreased as a result of degradation the tunnel oxide film.

Figure 6:
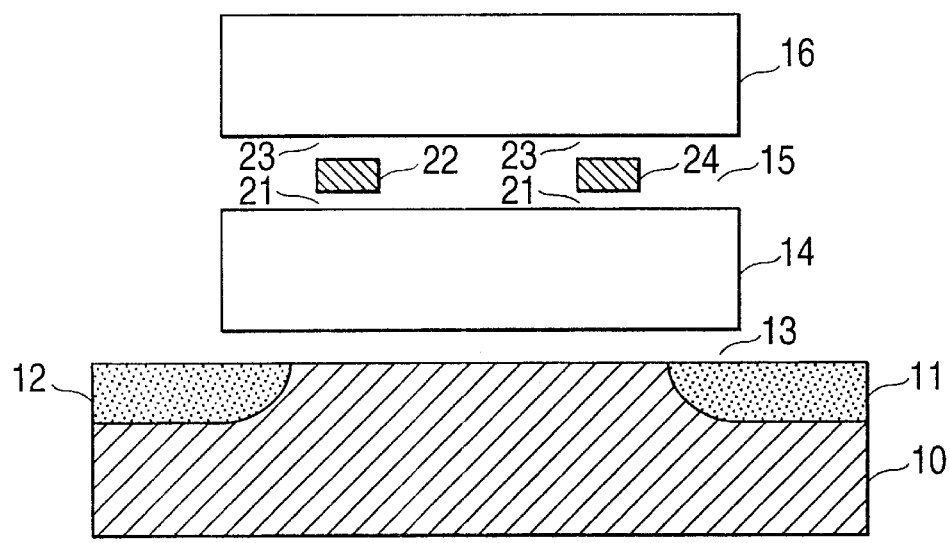
FIG. 6 is a cross-sectional view showing a nonvolatile memory according to a third preferred embodiment of the present invention.

FIG. 6 is cross-sectional view showing a nonvolatile memory according to a third preferred embodiment of the present invention.

As shown in FIG. 6, a nonvolatile memory according to a third preferred embodiment of the present invention preferably includes a first floating gate electrode 14, a control gate electrode 16, a tunnel oxide film 13 between the first floating gate electrode 14 and a semiconductor substrate 10, and a first insulating film 15 between the control gate electrode 16 and the first floating gate electrode 14. Further, the nonvolatile memory of the third preferred embodiment preferably includes a second floating gate electrode 22 which is sandwiched between the control gate electrode 16 and the first floating gate electrode 14, a second insulating film 21 which is sandwiched between the first floating gate electrode 14 and the second floating gate electrode 22, a third insulating film 23 which is sandwiched between the second floating gate electrodes 22 and the control gate electrode 16, a third floating gate electrode 24 which is sandwiched between the control gate electrode 16 and the first floating gate electrode 14, a second insulating film 21 which is sandwiched between the first floating gate electrode 14 and the third floating gate electrode 24, and a third insulating film 23 which is sandwiched between the third floating gate electrode 24 and the control gate electrode 16. The second and third insulating films 21, 23 have a combined thickness which is less than that of the first insulating film 15. For example, the semiconductor substrate 10 is a p-type silicon substrate, the source and drain regions 11, 12 are formed by ion-implanting Arsenic (As) into the semiconductor substrate, the tunnel oxide film 13 and the first, second and third insulating films 15, 21, 23 are a silicon oxide film, and the first, second and third floating gate electrodes 14, 22, 24 and the control gate electrode 16 are a polysilicon.

The nonvolatile memory is erased by applying a negative voltage to the semiconductor substrate 10 and by applying a positive voltage to the control gate electrode 16. At this time, since the second and third insulating films 21, 23 have a combined thickness which is less than that of the first insulating film 15, electric field is applied to the second and third insulating films 21, 23. Therefore, a tunneling occurs in the second and third insulating films 21, 23. As a result, the electrons in the first floating gate electrode 14 are drawn to the control gate electrode 16.

As mentioned above, since the nonvolatile memory of the third preferred embodiment provides a structure as mentioned above, the electrons in the first floating gate electrode 14 are drawn to the control gate electrode 16 via the second and third floating gate electrodes 22, 24 at the erasure cycle. As a result, the electrons do not flow in the tunnel oxide film 13. Therefore, the tunnel oxide film 13 does not degrade. Accordingly, the nonvolatile memory of the third preferred embodiment avoids the problem in which the number of program and erasure cycles is decreased as a result of degradation the tunnel oxide film.

Figure 7:
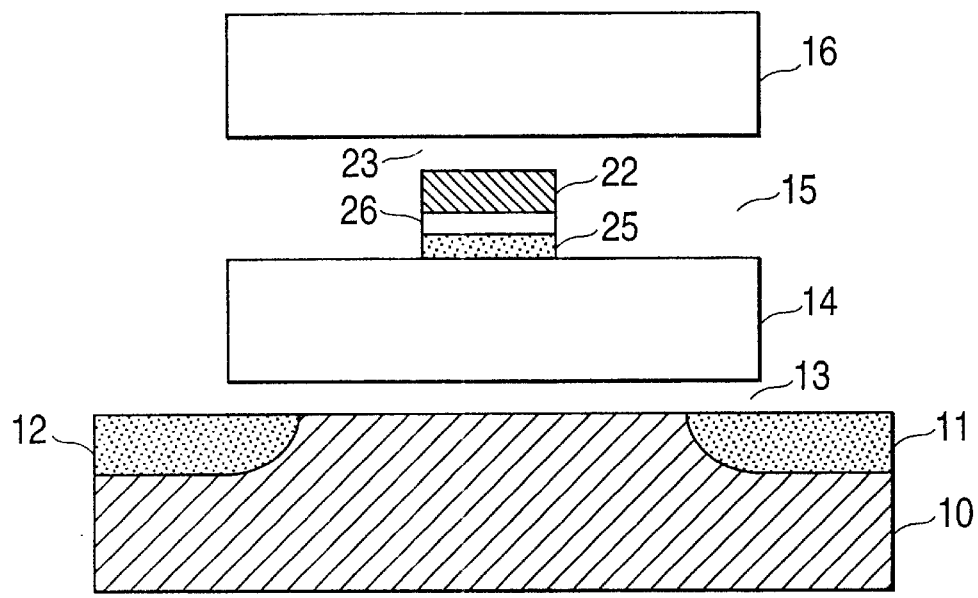
FIG. 7 is a cross-sectional view showing a nonvolatile memory according to a fourth preferred embodiment of the present invention.
Figure 8:
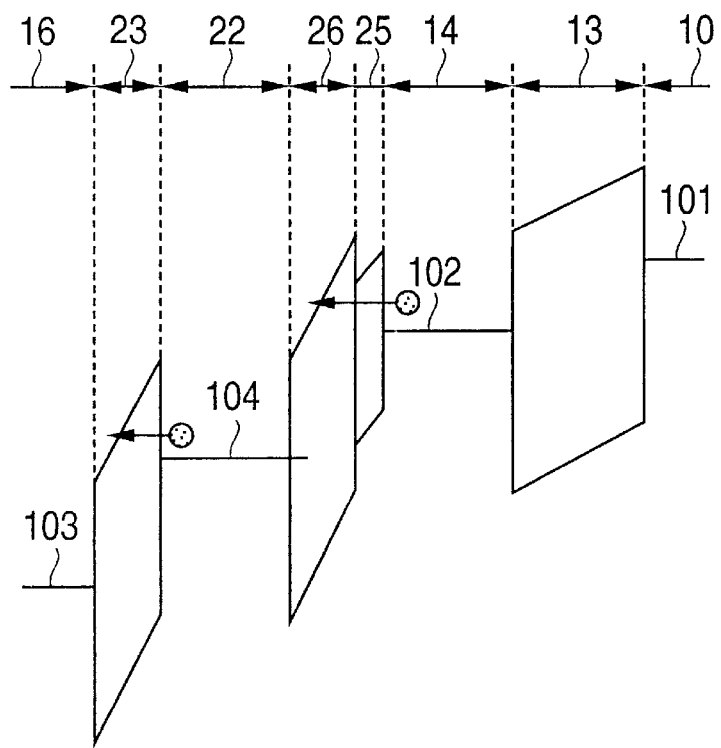
FIG. 8 is a schematic energy band diagram in an erase operation of a nonvolatile memory according to a fourth preferred embodiment.

FIG. 7 is a cross-sectional view showing a nonvolatile memory according to a fourth preferred embodiment of the present invention. FIG. 8 is a schematic energy band diagram in the erase operation of a nonvolatile memory according to a fourth preferred embodiment.

Figure 9:
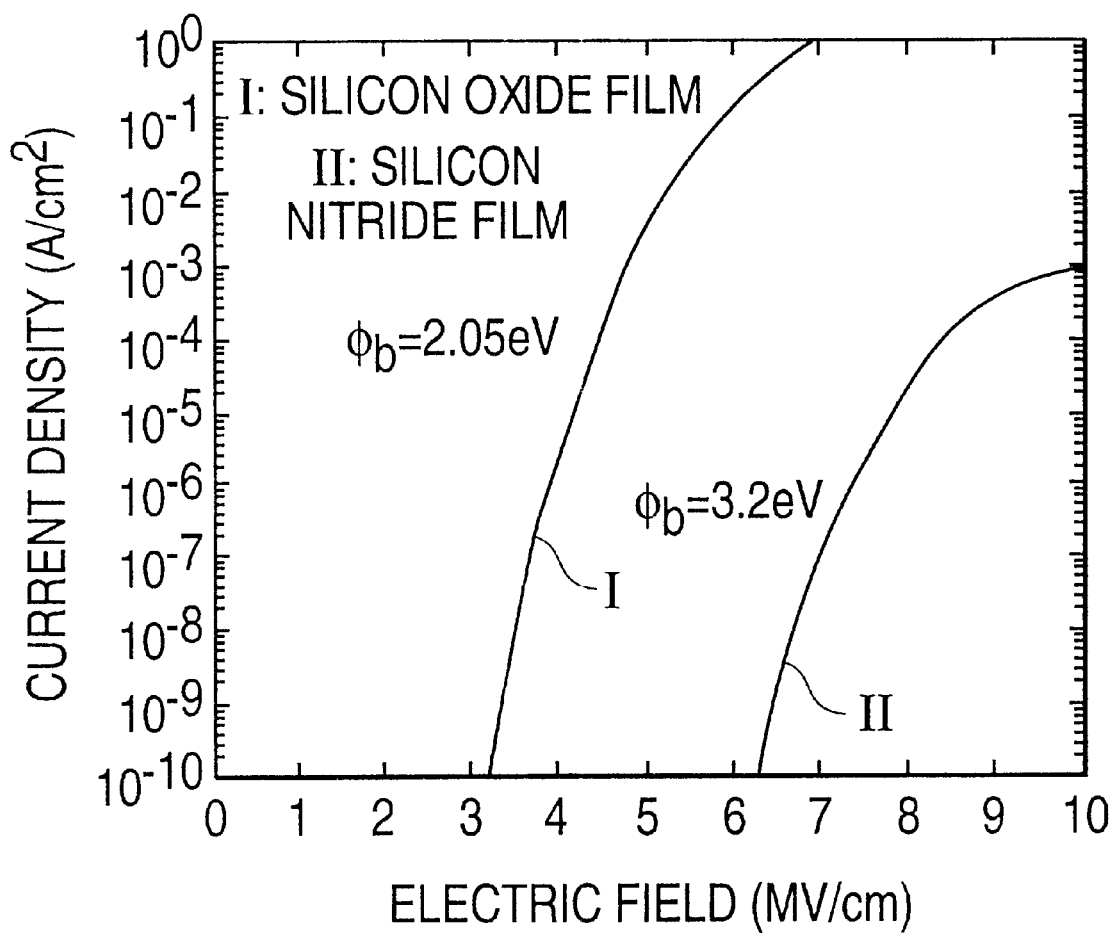
FIG. 9 is a graph showing a relation between a current density and an electric field for a silicon oxide film and silicon nitride film.

As shown in FIGS. 7 and 8, a nonvolatile memory according to a fourth preferred embodiment of the present invention preferably includes a first floating gate electrode 14, a control gate electrode 16, a tunnel oxide film 13 between the first floating gate electrode 14 and a semiconductor substrate 10, and a first insulating film 15 between the control gate electrode 16 and the first floating gate electrode 14. Further, the nonvolatile memory of the fourth preferred embodiment preferably includes a second floating gate electrode 22 which is sandwiched between the control gate electrode 16 and the first floating gate electrode 14, a second insulating film 23 which is sandwiched between the control gate electrode 16 and the second floating gate electrode 22, and a multiple layer structure 25, 26 which is sandwiched between the first and second floating gate electrodes 14, 22. The multiple layer structure 25, 26 is made up of third and fourth insulating layers 25, 26 which have respectively different barrier heights. Here, the third insulating layer 25 is a silicon nitride film having a low barrier height, and the fourth insulating layer 26 is a silicon oxide film having a high barrier height. At an erase cycle, a positive voltage is applied to the control gate electrode 16, and a negative voltage is applied to the semiconductor substrate 10. However, at the erase cycle, the erase step can be performed by applying to the control gate electrode 16 a voltage which is lower than the voltage applied to the control gate electrode 16 in the second preferred embodiment. This is because an FN tunneling current of the low barrier height in the same electric field is larger than that of the higher barrier height. FIG. 9 is a graph showing a relation between a current density and an electric field for the silicon nitride film having the low barrier height φ b, for example 2.05 eV, and the silicon oxide film having the high barrier height φ b, for example 3.20 eV. As shown in FIG. 8, the silicon nitride film 25 having the low barrier height is formed between the floating gate electrode 14 and the silicon oxide film 26 having the high barrier height. As a result, the fourth preferred embodiment can achieve FN tunneling current in the electric field which is lower than that of the first, second, and third embodiment.

As mentioned above, since the nonvolatile memory of the fourth preferred embodiment provides a structure as mentioned above, the electrons in the first floating gate electrode 14 are drawn to the control gate electrode 16 via the second floating gate electrode 22 and the third and fourth insulating layers 25, 26 at the erasure cycle. As a result, the electrons do not flow in the tunnel oxide film 13. Therefore, the tunnel oxide film 13 does not degrade. Accordingly, the nonvolatile memory of the fourth preferred embodiment avoids the problem in which the number of program and erasure cycles is decreased as a result of degradation the tunnel oxide film.

Further, in the fourth preferred embodiment, the silicon nitride film 25 having the low barrier height is formed between the first floating gate electrode 14 and the silicon oxide film 26 having the high barrier height, as a result, the fourth preferred embodiment can achieve FN tunneling current in an electric field which is lower than that of the first, second, and third embodiments.

Figure 10:
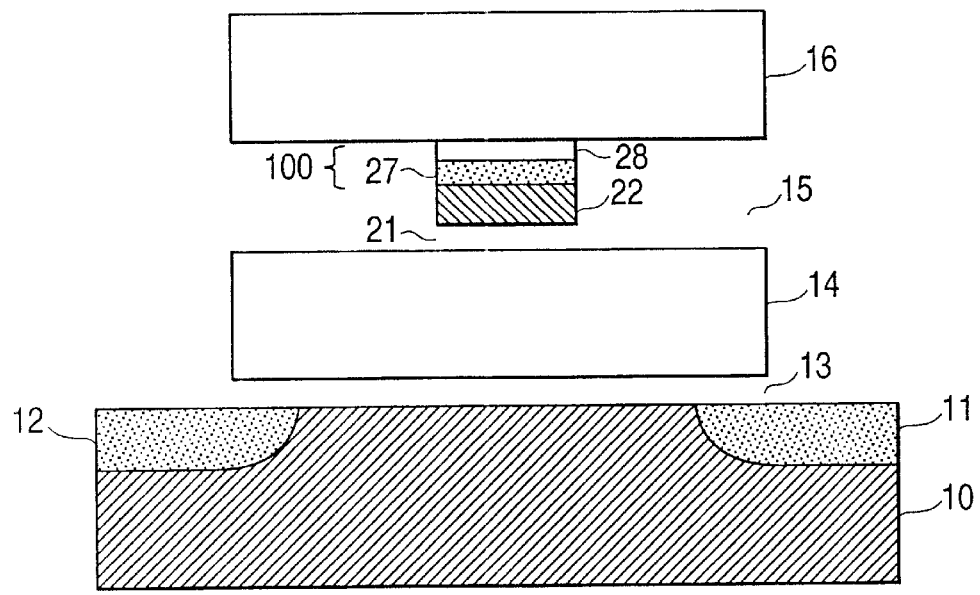
FIG. 10 is a cross-sectional view showing a nonvolatile memory according to a fifth preferred embodiment of the present invention.
Figure 11:
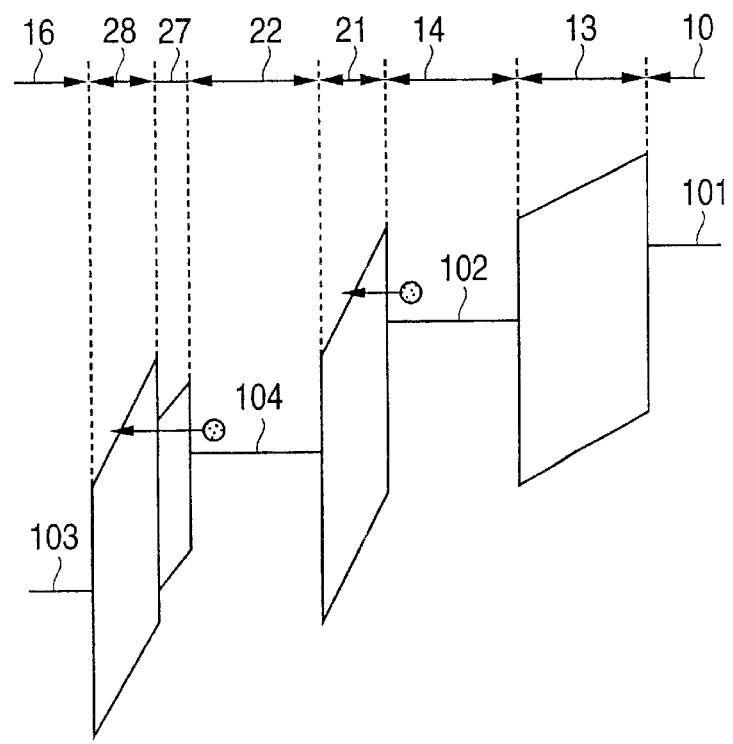
FIG. 11 is a schematic energy band diagram in an erase operation of a nonvolatile memory according to a fifth preferred embodiment.

FIG. 10 is a cross-sectional view showing a nonvolatile memory according to a fifth preferred embodiment of the present invention. FIG. 11 is a schematic energy band diagram in the erase operation of a nonvolatile memory according to a fifth preferred embodiment.

As shown in FIGS. 10 and 11, the fifth preferred embodiment uses a multiple layer structure 100 comprising first and second insulating layers 27, 28 having different barrier heights, instead of the second insulating layer 23 of the second preferred embodiment.

Therefore, the nonvolatile memory according to a fifth preferred embodiment of the present invention is preferably made up of a first floating gate electrode 14, a control gate electrode 16, a tunnel oxide film 13 between the first floating gate electrode 14 and a semiconductor substrate 10, and a first insulating film 15 between the control gate electrode 16 and the first floating gate electrode 14. Further, the nonvolatile memory of the fifth preferred embodiment preferably includes a second floating gate electrode 22 which is sandwiched between the control gate electrode 16 and the first floating gate electrode 14, a second insulating film 21 which is sandwiched between the first floating gate electrode 14 and the second floating gate electrode 22, multiple insulating layers 100 which are sandwiched between the second floating gate electrode 22 and the control gate electrode 16, and the source and drain regions 11, 12 which are formed on the semiconductor substrate 10. Further, the multiple layer structure 100 has different barrier heights.

As mentioned above, since the nonvolatile memory of the fifth preferred embodiment provides a structure as mentioned above, the electrons in the first floating gate electrode 14 are drawn to the control gate electrode 16 via the second floating gate electrode 22 and the multiple layer structure 100 at the erasure cycle. As a result, the electrons does not flow in the tunnel oxide film 13. Therefore, the tunnel oxide film 13 does not degrade. Accordingly, the nonvolatile memory of the fifth preferred embodiment avoids the problem in which the number of program and erasure cycles is decreased as a result of degradation the tunnel oxide film.

Figure 12:
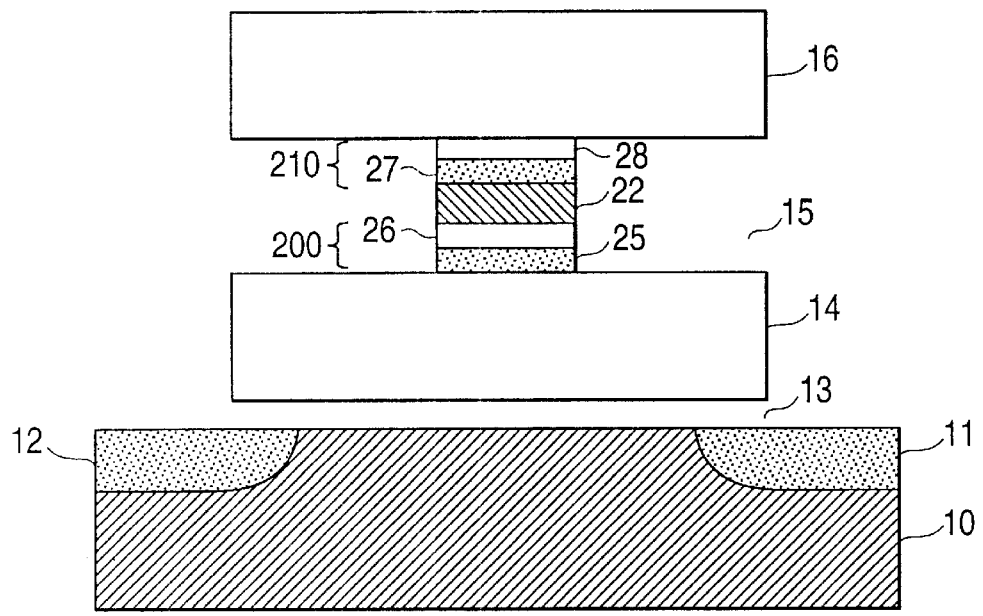
FIG. 12 is a cross-sectional view showing a nonvolatile memory according to a sixth preferred embodiment of the present invention.
Figure 13:
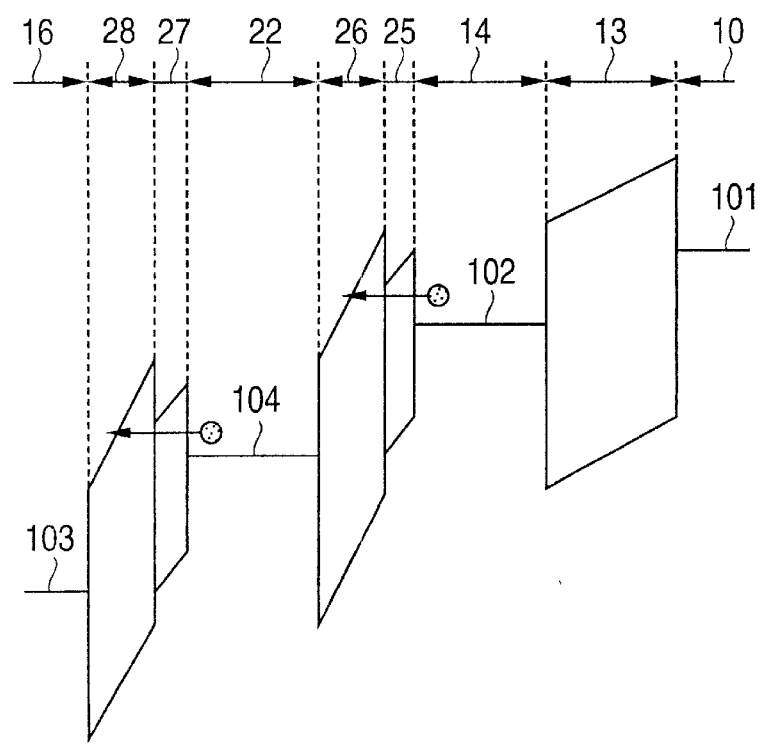
FIG. 13 is a schematic energy band diagram in an erase operation of a nonvolatile memory according to a sixth preferred embodiment.

FIG. 12 is a cross-sectional view showing a nonvolatile memory according to a sixth preferred embodiment of the present invention. FIG. 13 is a schematic energy band diagram in the erase operation of a nonvolatile memory according to a sixth preferred embodiment.

As shown in FIGS. 12 and 13, the sixth preferred embodiment is preferably made up of a structure which combines the characteristics of the fourth and fifth preferred embodiments, respectively.

Therefore, the nonvolatile memory according to a sixth preferred embodiment of the present invention is preferably made up of a first floating gate electrode 14, a control gate electrode 16, a tunnel oxide film 13 between the first floating gate electrode 14 and a semiconductor substrate 10, and a first insulating film 15 between the control gate electrode 16 and the first floating gate electrode 14. Further, the nonvolatile memory of the sixth preferred embodiment preferably includes a second floating gate electrode 22 which is sandwiched between the control gate electrode 16 and the first floating gate electrode 14, a first multiple insulating layer 200 which are sandwiched between the first floating gate electrode 14 and the second floating gate electrode 22, a second multiple insulating layer 210 which is sandwiched between the second floating gate electrode 22 and the control gate electrode 16, and the source and drain regions 11, 12 which are formed on the semiconductor substrate 10. Further, the multiple layers 27, 28 have a different barrier height.

The first multiple layer 200 are made up of second and third insulating layers 25, 26. The second and third insulating layers 25, 26 have different barrier heights. The second multiple layer 210 is preferably made up of fourth and fifth insulating layers 27, 28. The fourth and fifth insulating layers 27, 28 have different barrier heights.

As mentioned above, since the nonvolatile memory of the sixth preferred embodiment provides a structure as mentioned above, the electrons in the first floating gate electrode 14 are drawn to the control gate electrode 16 via the second floating gate electrode 22 and the first and second multiple layers 200, 210 at the erasure cycle. As a result, the electrons do not flow in the tunnel oxide film 13. Therefore, the tunnel oxide film 13 does not degrade. Accordingly, the nonvolatile memory of the sixth preferred embodiment avoids the problem in which the number of program and erasure cycles is decreased as a result of degradation the tunnel oxide film.

Figure 14:
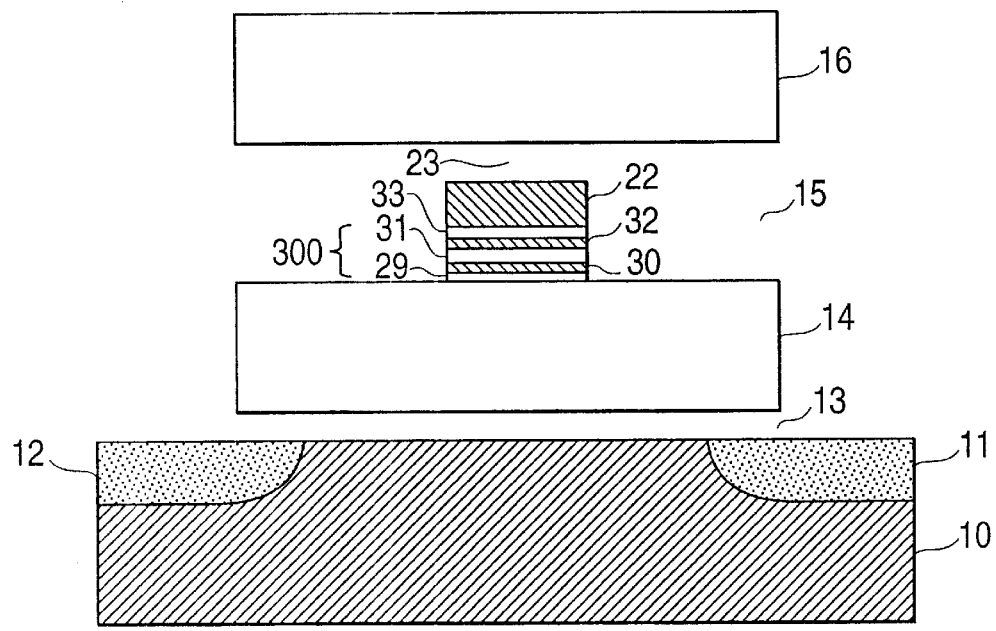
FIG. 14 is a cross-sectional view showing a nonvolatile memory according to a seventh preferred embodiment of the present invention.
Figure 15:
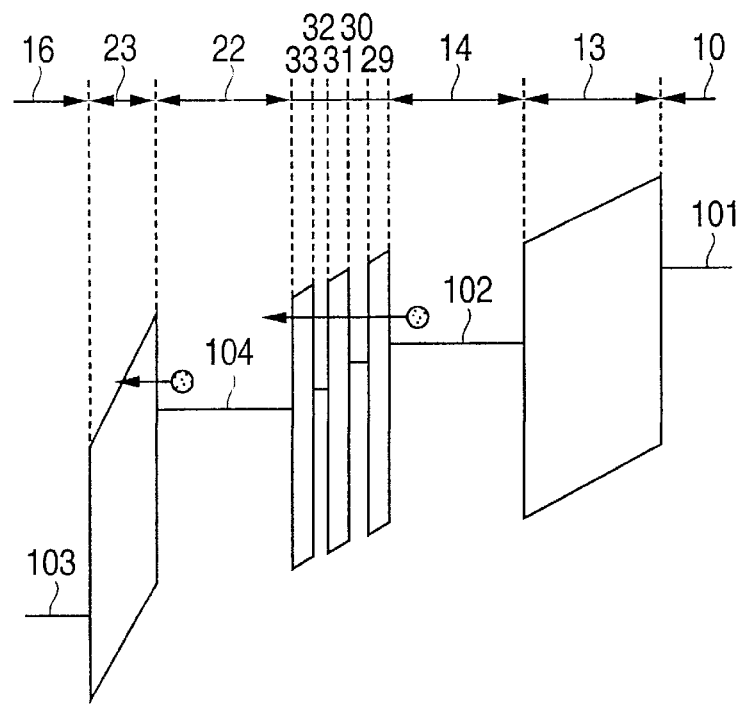
FIG. 15 is a schematic energy band diagram in an erase operation of a nonvolatile memory according to a seventh preferred embodiment.

FIG. 14 is a cross-sectional view showing a nonvolatile memory according to a seventh preferred embodiment of the present invention. FIG. 15 is a schematic energy band diagram in the erase operation of a nonvolatile memory according to a seventh preferred embodiment.

As shown in FIGS. 14 and 15, a nonvolatile memory according to a seventh preferred embodiment of the present invention is preferably made up of a first floating gate electrode 14, a control gate electrode 16, a tunnel oxide film 13 between the first floating gate electrode 14 and a semiconductor substrate 10, and a first insulating film 15 between the control gate electrode 16 and the first floating gate electrode 14. Further, the nonvolatile memory of the seventh preferred embodiment preferably includes a second floating gate electrode 22 which is sandwiched between the control gate electrode 16 and the first floating gate electrode 14, a second insulating film 23 which is sandwiched between the control gate electrode 16 and the second floating gate electrode 22, and a multiple layer structure 300 which is sandwiched between the first and second floating gate electrodes 14, 22. The multiple layer structure 300 is made up of third, fourth, and fifth insulating layers 29, 31, 33 and first and second semiconductor layers (or first and second metal layers) 30, 32. Here, the insulating layers and the semiconductor layers are alternatively formed. For example, the insulating layers are a silicon oxide film or a silicon nitride film. The thickness of the insulating layers is set so that electrons move with direct tunneling. For example, the semiconductor layers are a polysilicon, a molybdenum, or a tungsten.

The seventh preferred embodiment can erase at a voltage which is lower than that of the second preferred embodiment. This is because the direct tunneling of the plurality of the insulating layers, causes the electronic energy to become high. As a result, the effective barrier height becomes low.

As mentioned above, since the nonvolatile memory of the seventh preferred embodiment provides a structure as mentioned above, the electrons in the first floating gate electrode 14 are drawn to the control gate electrode 16 via the second floating gate electrode 22 and the multiple layer structure 300 at the erasure cycle. As a result, the electrons do not flow in the tunnel oxide film 13. Therefore, the tunnel oxide film 13 does not degrade. Accordingly, the nonvolatile memory of the seventh preferred embodiment avoids the problem in which the number of program and erasure cycles is decreased as a result of degradation the tunnel oxide film.

Figure 16:
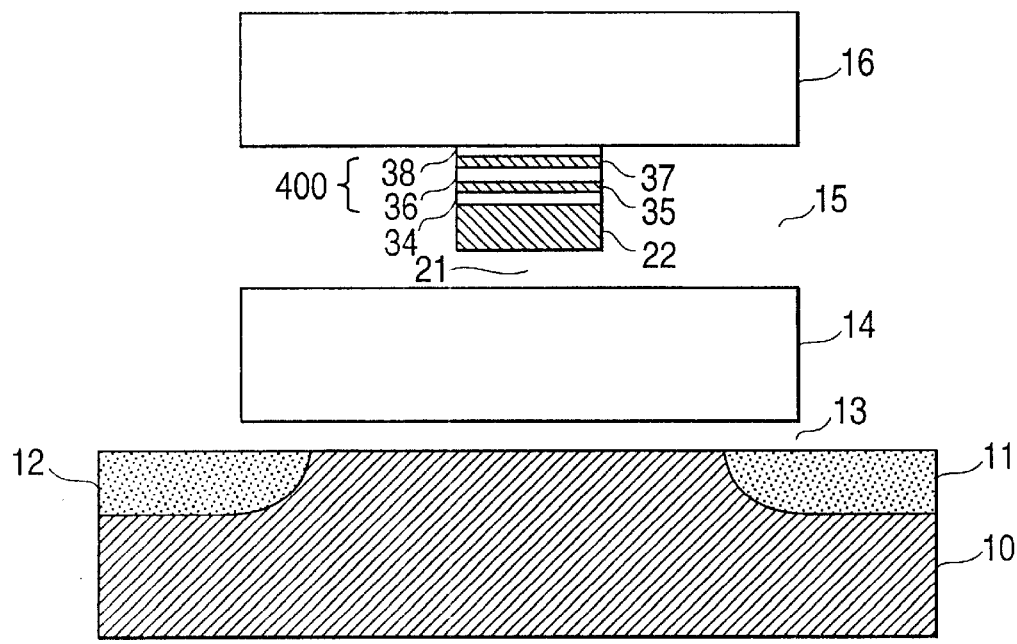
FIG. 16 is a cross-sectional view showing a nonvolatile memory according to an eighth preferred embodiment of the present invention.
Figure 17:
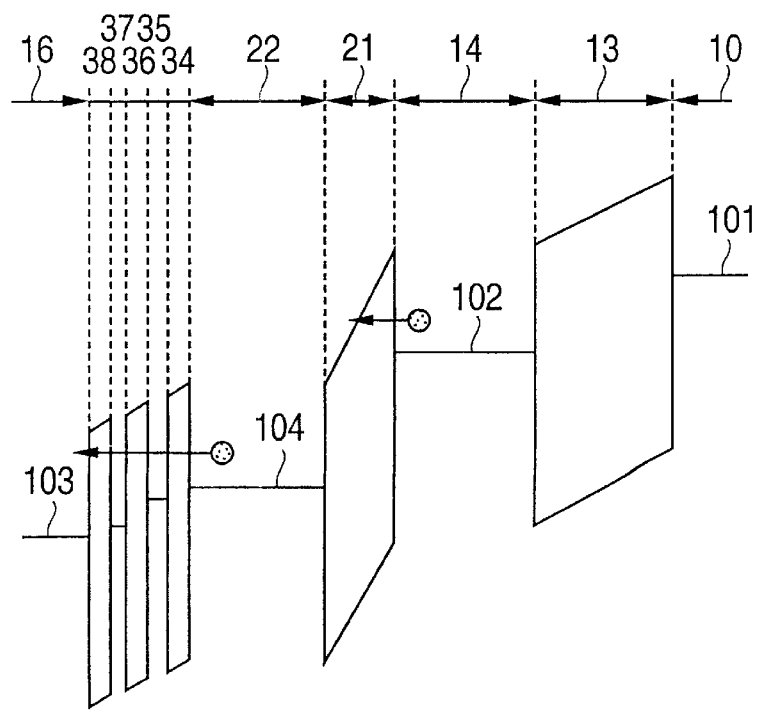
FIG. 17 is a schematic energy band diagram in an erase operation of a nonvolatile memory according to an eighth preferred embodiment.

FIG. 16 is a cross-sectional view showing a nonvolatile memory according to an eighth preferred embodiment of the present invention. FIG. 17 is a schematic energy band diagram in the erase operation of a nonvolatile memory according to an eighth preferred embodiment.

As shown in FIGS. 16 and 17, the nonvolatile memory according to a eighth preferred embodiment of the present invention is preferably made up of a first floating gate electrode 14, a control gate electrode 16, a tunnel oxide film 13 between the first floating gate electrode 14 and a semiconductor substrate 10, and a first insulating film 15 between the control gate electrode 16 and the first floating gate electrode 14. Further, the nonvolatile memory of the eighth preferred embodiment is preferably made up of a second floating gate electrode 22 which is sandwiched between the control gate electrode 16 and the first floating gate electrode 14, a second insulating film 21 which is sandwiched between the first and second floating gate electrodes 14 and 22, a multiple layer structure 400 which is sandwiched between the second floating gate electrode 22 and the control gate electrode 16.

The multiple layer 400 is made up of third, fourth, and fifth insulating layers 34, 36, and 38 and first and second semiconductor layers (or first and second metal layers) 35 and 37. Here, the insulating layers and the semiconductor layers are alternatively formed. For example, the insulating layers are a silicon oxide film or a silicon nitride film. The thickness of the insulating layers is set so that electrons move with direct tunneling. For example, the semiconductor layers are a polysilicon, a molybdenum, or a tungsten.

The eighth preferred embodiment can erase at a voltage which is lower than that of the second preferred embodiment. This is because the direct tunneling of the plurality of the insulating layers causes the electronic energy to become high. As a result, the effective barrier height becomes low.

As mentioned above, since the nonvolatile memory of the eighth preferred embodiment provides a structure as mentioned above, the electrons in the first floating gate electrode 14 are drawn to the control gate electrode 16 via the second floating gate electrode 22 and the multiple layer structure 400 at the erasure cycle. As a result, the electrons does not flow in the tunnel oxide film 13. Therefore, the tunnel oxide film 13 does not degrade. Accordingly, the nonvolatile memory of the eighth preferred embodiment avoids the problem in which the number of program and erasure cycles is decreased as a result of degradation the tunnel oxide film.

Figure 18:
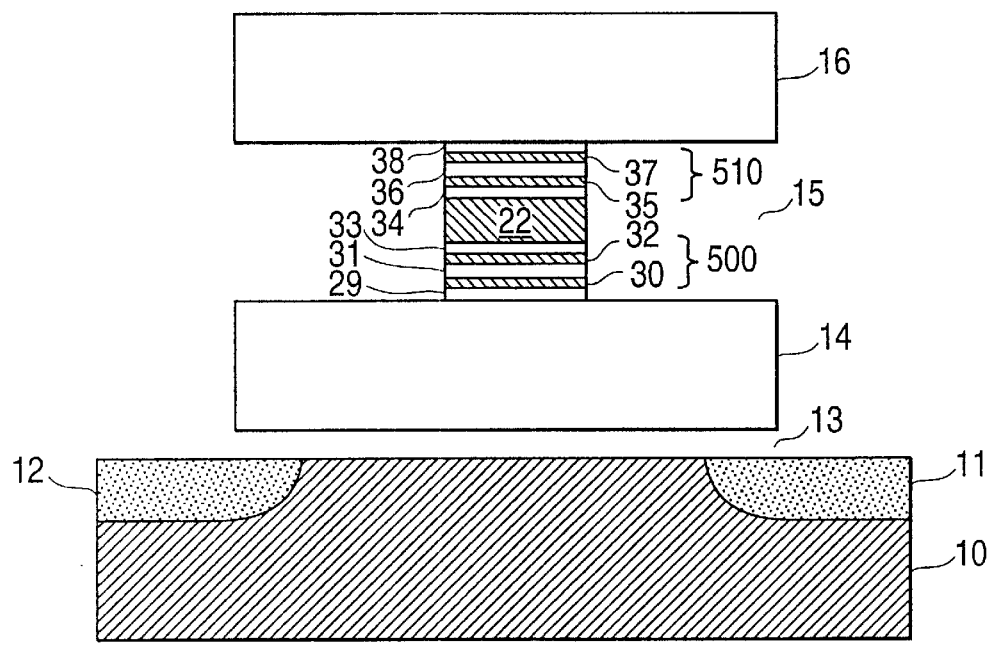
FIG. 18 is a cross-sectional view showing a nonvolatile memory according to a ninth preferred embodiment of the present invention.
Figure 19:
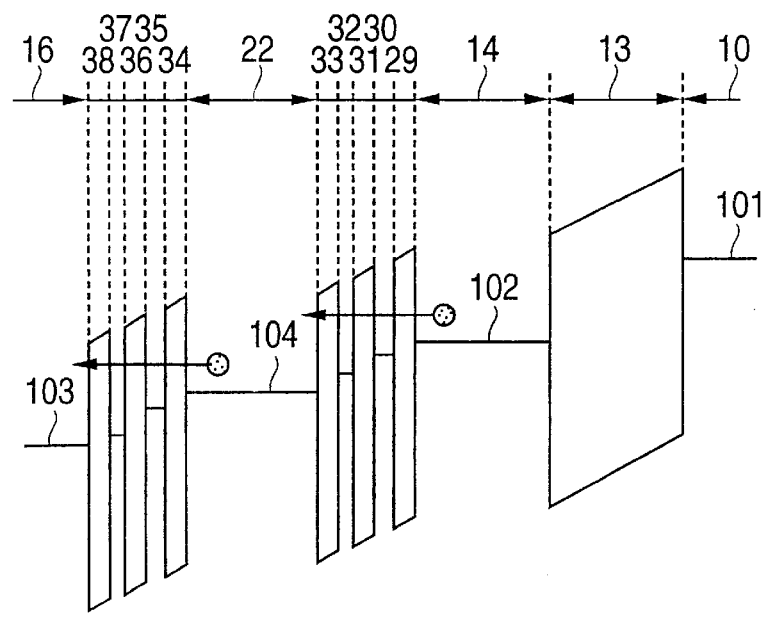
FIG. 19 is a schematic energy band diagram in an erase operation of a nonvolatile memory according to a ninth preferred embodiment.

FIG. 18 is a cross-sectional view showing a nonvolatile memory according to a ninth preferred embodiment of the present invention. FIG. 19 is a schematic energy band diagram in the erase operation of a nonvolatile memory according to a ninth preferred embodiment.

As shown in FIGS. 18 and 19, the ninth preferred embodiment is preferably made up of a structure which combines the characteristics of the seventh and eighth preferred embodiments, respectively.

Therefore, the nonvolatile memory according to a ninth preferred embodiment of the present invention is preferably made up of a first floating gate electrode 14, a control gate electrode 16, a tunnel oxide film 13 between the first floating gate electrode 14 and a semiconductor substrate 10, and a first insulating film 15 between the control gate electrode 16 and the first floating gate electrode 14. Further, the nonvolatile memory of the ninth preferred embodiment preferably includes a second floating gate electrode 22 which is sandwiched between the control gate electrode 16 and the first floating gate electrode 14, a first multiple layer structure 500 which is sandwiched between the first and second floating gate electrodes 14, 22, a second multiple layer structure 510 which is sandwiched between the second floating gate electrode 22 and the control gate electrode 16, and the source and drain regions 11, 12 which are formed on the semiconductor substrate 10. The first multiple layer structure 500 is made up of third, fourth, and fifth insulating layers 29, 31, 33 and first and second semiconductor layers (or first and second metal layers) 30, 32. Here, the insulating layers and the semiconductor layers are alternatively formed. For example, the insulating layers are a silicon oxide film or a silicon nitride film. The thickness of the insulating layers is set so that electrons move with direct tunneling. For example, the semiconductor layers are a polysilicon, a molybdenum, or a tungsten. The second multiple layer structure 510 is made up of sixth, seventh, and eighth insulating layers 34, 36, and 38 and third and fourth semiconductor layers (or first and second metal layers) 35 and 37. Here, the insulating layers and the semiconductor layers are alternatively formed. For example, the insulating layers are a silicon oxide film or a silicon nitride film. The thickness of the insulating layers is set so that electrons move with the direct tunneling. For example, the semiconductor layers are a polysilicon, a molybdenum, or a tungsten.

The ninth preferred embodiment can erase at a voltage which is lower than the seventh and eight preferred embodiments. This is because with the direct tunneling a plurality of the insulating layers causes the electronic energy to become high. As a result, the effective barrier height becomes low.

As mentioned above, since the nonvolatile memory of the ninth preferred embodiment provides a structure as mentioned above, the electrons in the first floating gate electrode 14 are drawn to the control gate electrode 16 via the second floating gate electrode 22 and the first and second multiple layer structures 500, 510 at the erasure cycle. As a result, the electrons do not flow in the tunnel oxide film 13. Therefore, the tunnel oxide film 13 does not degrade. Accordingly, the nonvolatile memory of the ninth preferred embodiment avoids the problem in which the number of program and erasure cycles is decreased as a result of degradation the tunnel oxide film.

Figure 20:
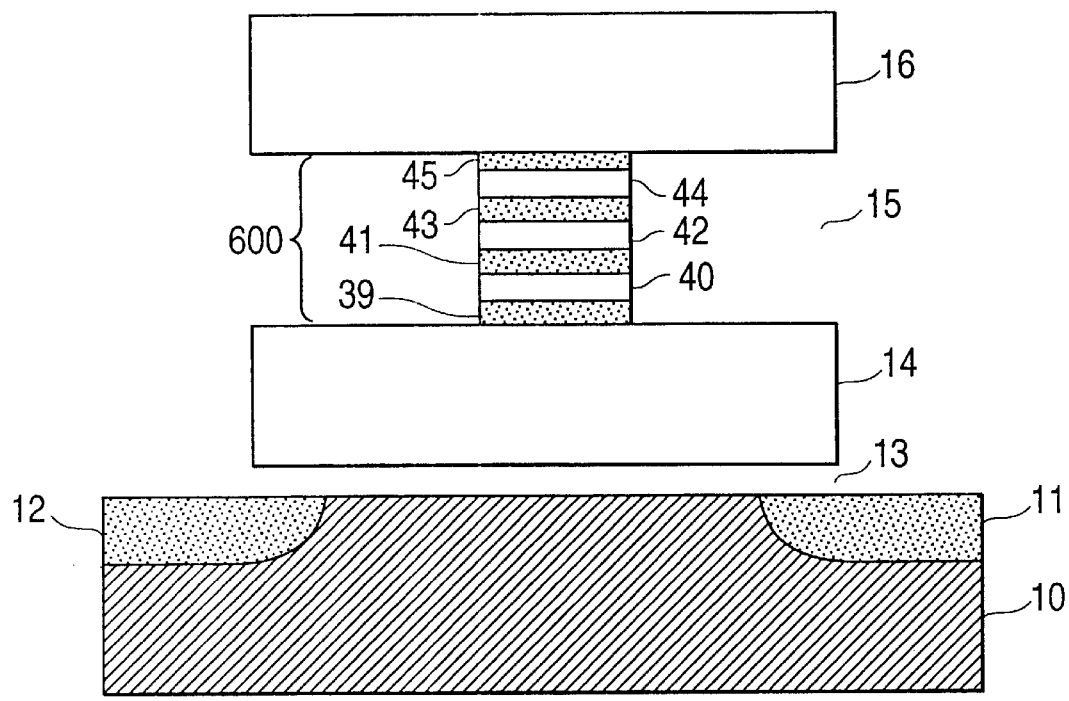
FIG. 20 is a cross-sectional view showing a nonvolatile memory according to a tenth preferred embodiment of the present invention.
Figure 21:
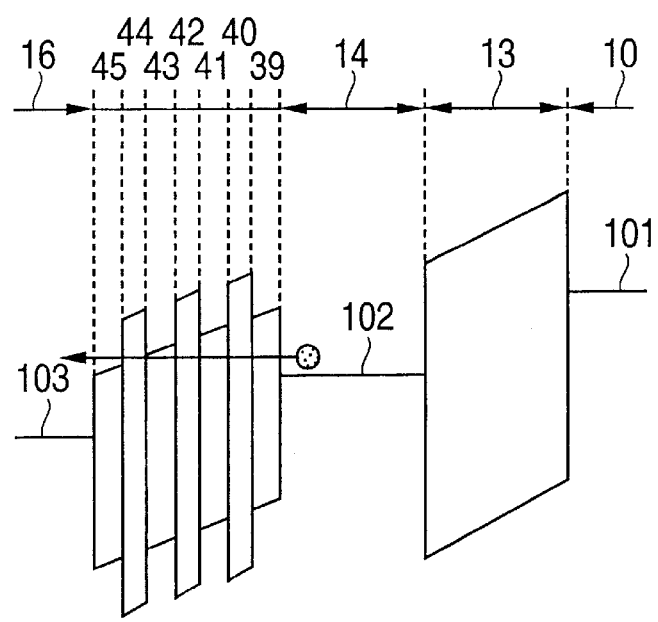
FIG. 21 is a schematic energy band diagram in an erase operation of a nonvolatile memory according to a tenth preferred embodiment.

FIG. 20 is a cross-sectional view showing a nonvolatile memory according to a tenth preferred embodiment of the present invention. FIG. 21 is a schematic energy band diagram in the erase operation of a nonvolatile memory according to a tenth preferred embodiment.

As shown in FIGS. 20 and 21, a nonvolatile memory according to a tenth preferred embodiment of the present invention preferably includes a floating gate electrode 14, a control gate electrode 16, a tunnel oxide film 13 between the floating gate electrode 14 and a semiconductor substrate 10 having a source region 11 and a drain region 12 on a surface, a first insulating film 15 between the control gate electrode 16 and the floating gate electrode 14, and a multiple layer structure 600 which is sandwiched between the control gate electrode 16 and the floating gate electrode 14. Here, the multiple layer structure 600 is formed of two kinds of insulating layers 39, 40, 41, 42, 43, 44, and 45 having a different barrier height, alternatively.

As mentioned above, since the nonvolatile memory of the tenth preferred embodiment provides a structure as mentioned above, the electrons in the floating gate electrode 14 are drawn to the control gate electrode 16 via the multiple layer structure 600 at the erasure cycle. As a result, the electrons do not flow in the tunnel oxide film 13. Therefore, the tunnel oxide film 13 does not degrade. Accordingly, the nonvolatile memory of the tenth preferred embodiment avoids the problem in which the number of program and erasure cycles is decreased as a result of degradation the tunnel oxide film.

Figure 22:
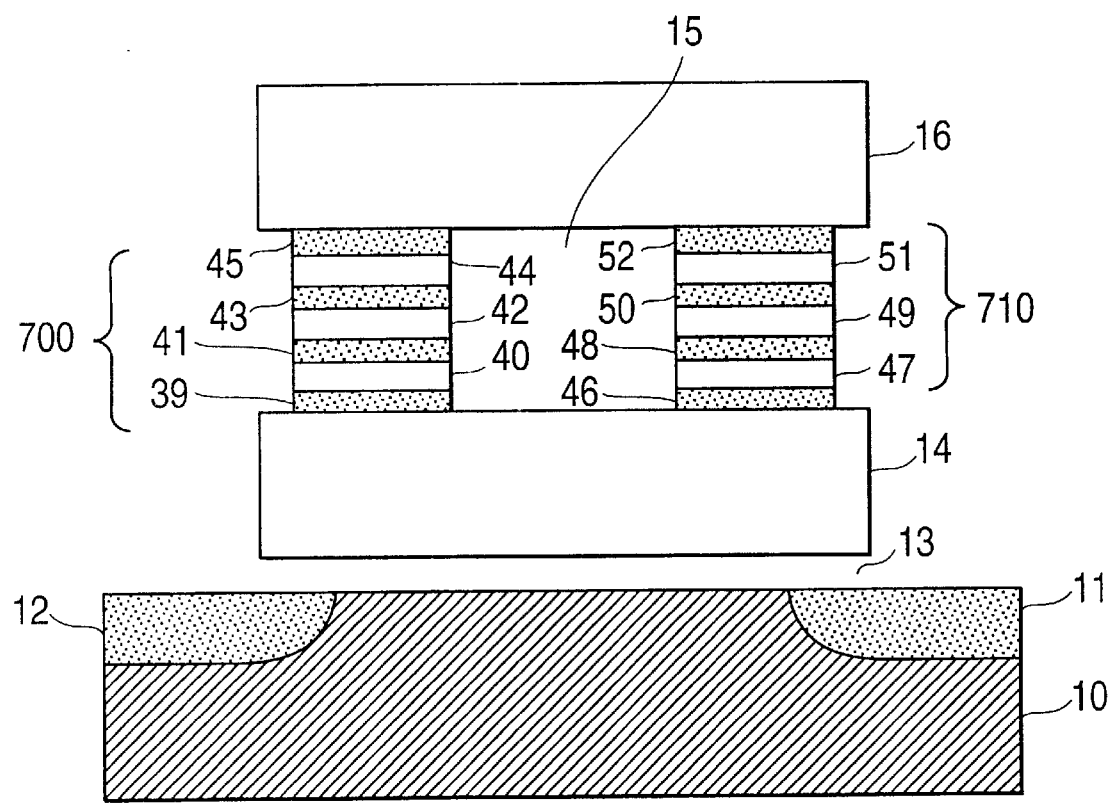
FIG. 22 is a cross-sectional view showing a nonvolatile memory according to an eleventh preferred embodiment of the present invention.

FIG. 22 is a cross-sectional view showing a nonvolatile memory according to an eleventh preferred embodiment of the present invention.

As shown in FIGS. 22, a nonvolatile memory according to an eleventh preferred embodiment of the present invention preferably includes a floating gate electrode 14, a control gate electrode 16, a tunnel oxide film 13 between the floating gate electrode 14 and a semiconductor substrate 10 having a source region 11 and a drain region 12 on a surface, a first insulating film 15 between the control gate electrode 16 and the floating gate electrode 14, a first multiple layer structure 700 which is sandwiched between the control gate electrode 16 and the floating gate electrode 14, and a second multiple layer structure 710 which is sandwiched between the control gate electrode 16 and the floating gate electrode 14. Here, the first multiple layer structure 700 is formed of two kinds of insulating layers 39, 40, 41, 42, 43, 44, and 45 having different barrier heights, alternatively. These second multiple layer structure 710 is formed of two kinds of insulating layers 46, 47, 48, 49, 50, 51, and 52 having different barrier heights, alternatively.

As mentioned above, since the nonvolatile memory of the eleventh preferred embodiment provides a structure as mentioned above, the electrons in the floating gate electrode 14 are drawn to the control gate electrode 16 via the first and second multiple layer structures 700, 710 at the erasure cycle. As a result, the electrons do not flow in the tunnel oxide film 13. Therefore, the tunnel oxide film 13 does not degrade. Accordingly, the nonvolatile memory of the eleventh preferred embodiment avoids the problem in which the number of program and erasure cycles is decreased as a result of degradation the tunnel oxide film.

Figure 23A:
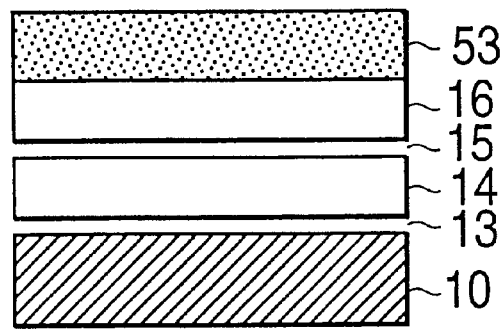
FIGS. 23A–23G are cross-sectional views showing a method of forming a nonvolatile memory according to a third preferred embodiment of the present invention.

As shown in FIG. 23A, a field oxide film (not shown) is formed on a semiconductor substrate 10 surface using the LOCOS (LOCal Oxidation of Silicon). A silicon oxide film 13 as a tunnel oxide film, a phosphorous-doped silicon layer 14 as a first floating gate electrode, a silicon oxide film 15 as a first insulating film, a phosphorous-doped silicon layer 16 as a control gate electrode, and a silicon nitride film 53 as a mask layer, are successively formed on the silicon substrate 10 surface. Here, the field oxide film has a thickness of 100–1000 nm. The silicon oxide film 13 has a thickness of 3–20 nm, which is formed by a CVD (Chemical Vapor Deposition) process or thermal oxidation. The phosphorous-doped silicon layer 14 has a thickness of 5–20 nm, and is formed by a CVD process or a sputtering process. The silicon oxide film 15 has a thickness of 5–20 nm, and is formed by a CVD process or a sputtering process. The silicon nitride film 53 has a thickness of 30–100 nm, and is formed by a CVD process or a sputtering process.

Figure 23B:
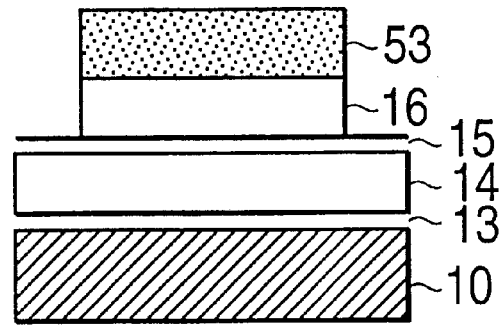

As shown in FIG. 23B, the mask layer 53 is formed by patterning the silicon nitride film 53 using anisotropic etching. The control gate electrode 16 is formed by patterning the phosphorous-doped silicon layer 16 using the mask layer 53.

Figure 23C:
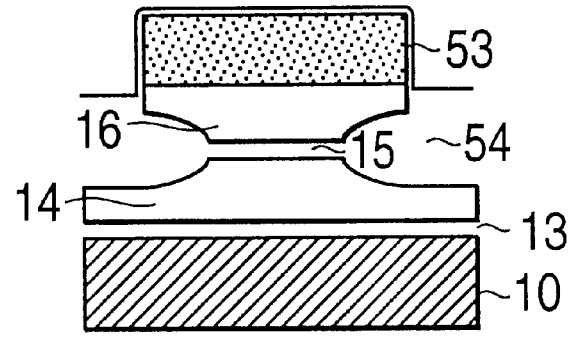

As shown in FIG. 23C, a birds-beak layer 54 of an oxide layer is formed in the silicon oxide film 15 between the silicon oxide film 13 and the phosphorous-doped silicon layer 14 using thermal oxidation.

Figure 23D:
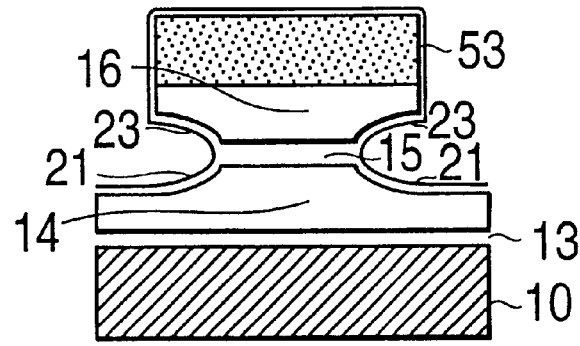

As shown in FIG. 23D, the birds-beak layer 54 is removed using isotropic etching. Then, oxide layers 21, 23 are respectively formed on each of the phosphorous-doped silicon layer 14 surface and the control gate electrode 16 surface in a removed portion. The each of the phosphorous-doped silicon layer 14 surface and the control gate electrode 16 has a thickness of 3–20 nm.

Figure 23E:
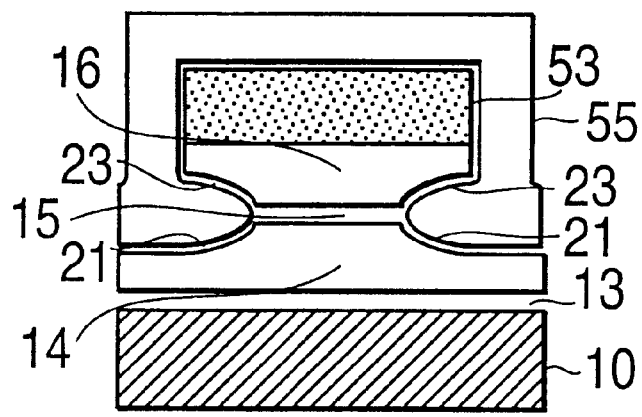

As shown in FIG. 23E, a-phosphorous-doped silicon layer 55 is formed on the entire surface using a CVD process or a sputtering process.

Figure 23F:
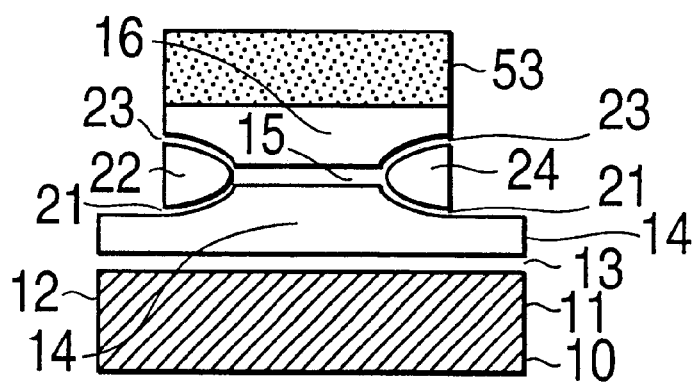

As shown in FIG. 23F, a portion of the phosphorous-doped silicon layer 55 selectively remains in the removed portion using the isotropic etching. As a result, the portion of the phosphorous-doped silicon layer 55 serves as second and third floating gate electrodes 22, 24.

Figure 23G:
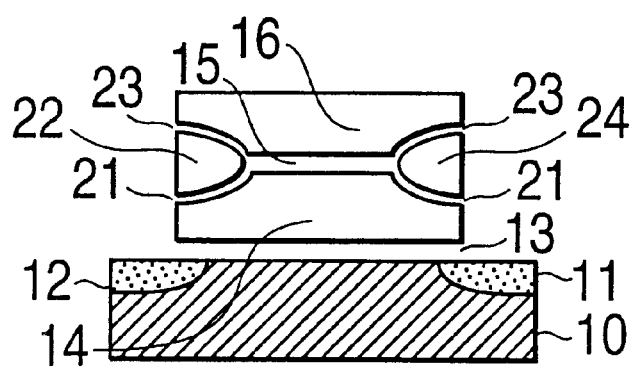

As shown in FIG. 23G, the first floating gate electrode 14 is formed by patterning the phosphorous-doped silicon layer 14 using anisotropic etching. Then, source and drain regions 11, 12 are formed on the semiconductor 10 surface. Then, the mask layer 53 is removed from the control gate electrode 16 upper surface.

As mentioned above, the method of forming a nonvolatile memory according to the third preferred embodiment can form the second and third floating gate electrodes 22, 24 without using the mask layer. Therefore, the method of forming a nonvolatile memory according to the third preferred embodiment can form a nonvolatile memory having another floating gate electrode without increasing the number of masks.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A nonvolatile memory having a floating gate electrode, a control gate electrode, a tunnel oxide film between the floating gate electrode and a semiconductor substrate, and a first insulating film sandwiched between and directly contacting the control gate electrode and the floating gate electrode, comprising:
   a second insulating film which is sandwiched between and directly contacting the control gate electrode and the floating gate electrode, the second insulating film adjoining with the first insulating film and having a barrier height which is lower than a barrier height of the first insulating film.

2. The nonvolatile memory as claimed in claim 1, wherein the second insulating film serves as a charge transfer layer during a write operation.

3. A nonvolatile memory having a first floating gate electrode, a control gate electrode, a tunnel oxide film between the first floating gate electrode and a semiconductor substrate, and a first insulating film sandwiched between and directly contacting the control gate electrode and the first floating gate electrode, comprising:
   a second floating gate electrode which is sandwiched between the control gate electrode and the first floating gate electrode;
   a second insulating film which is sandwiched between and directly contacting the control gate electrode and the second floating gate electrode; and
   a third insulating film which is sandwiched between and directly contacting the first and second floating gate electrodes,
   the second and third insulating films having a combined thickness which is less than a thickness of the first insulating film.

4. The nonvolatile memory as claimed in claim 3, further comprising:
   a third floating gate electrode which is sandwiched between the control gate electrode and the first floating gate electrode;
   a fourth insulating film which is sandwiched between and directly contacting the control gate electrode and the second floating gate electrode; and
   a fifth insulating film which is sandwiched between and directly contacting the first and second floating gate electrodes, the fourth and fifth insulating films having a combined thickness which is less than a thickness of the first insulating film.

5. A nonvolatile memory having a first floating gate electrode, a control gate electrode, a tunnel oxide film between the first floating gate electrode and a semiconductor substrate, and a first insulating film sandwiched between and directly contacting the control gate electrode and the first floating gate electrode, comprising:
- a second floating gate electrode which is sandwiched between the control gate electrode and the first floating gate electrode;
- a second insulating film which is sandwiched between and directly contacting the control gate electrode and the second floating gate electrode; and
- a multiple layer structure which is sandwiched between and directly contacting the first and second floating gate electrodes, the multiple layer structure comprising third and fourth insulating films, the third and fourth insulating films having different barrier heights, respectively.

6. The nonvolatile memory as claimed in claim 5, wherein the third and fourth insulating films are made of different insulating materials, respectively.

7. A nonvolatile memory having a first floating gate electrode, a control gate electrode, a tunnel oxide film between the first floating gate electrode and a semiconductor substrate, and a first insulating film sandwiched between and directly contacting the control gate electrode and the first floating gate electrode, comprising:
- a second floating gate electrode which is sandwiched between the control gate electrode and the first floating gate electrode;
- a second insulating film which is sandwiched between and directly contacting the first and second floating gate electrodes; and
- a multiple layer structure which is sandwiched between and directly contacting the control gate electrode and the second floating gate electrode, the multiple layer structure comprising third and fourth insulating films, the third and fourth insulating films having different barrier heights, respectively.

8. The nonvolatile memory as claimed in claim 7, wherein the third and fourth insulating films are made of different insulating materials, respectively.

9. A nonvolatile memory having a first floating gate electrode, a control gate electrode, a tunnel oxide film between the first floating gate electrode and a semiconductor substrate, and a first insulating film sandwiched between and directly contacting the control gate electrode and the first floating gate electrode, comprising:
- a second floating gate electrode which is sandwiched between the control gate electrode and the first floating gate electrode;
- a first multiple layer structure which is sandwiched between and directly contacting the first and second floating gate electrodes, the first multiple layer structure comprising second and third insulating films, the second and third insulating films having different barrier heights, respectively; and
- a second multiple layer structure which is sandwiched between and directly contacting the control gate electrode and the second floating gate electrode, the second multiple layer structure comprising fourth and fifth insulating films, the fourth and fifth insulating films having different barrier heights, respectively.

10. The nonvolatile memory as claimed in claim 9, wherein the second and third insulating films are made of different insulating materials, respectively, and the fourth and fifth insulating films are made of different insulating materials, respectively.

11. A nonvolatile memory having a first floating gate electrode, a control gate electrode, a tunnel oxide film between the first floating gate electrode and a semiconductor substrate, and a first insulating film sandwiched between and directly contacting the control gate electrode and the first floating gate electrode, comprising:
- a second floating gate electrode which is sandwiched between the control gate electrode and the first floating gate electrode;
- a second insulating film which is sandwiched between and directly contacting the control gate electrode and the second floating gate electrode; and
- a multiple layer structure which is sandwiched between and directly contacting the first and second floating gate electrodes, the multiple layer structure including alternatively formed conductive layers and third insulating films.

12. A nonvolatile memory having a first floating gate electrode, a control gate electrode, a tunnel oxide film between the first floating gate electrode and a semiconductor substrate, and a first insulating film sandwiched between and directly contacting the control gate electrode and the first floating gate electrode, comprising:
- a second floating gate electrode which is sandwiched between the control gate electrode and the first floating gate electrode;
- a second insulating film which is sandwiched between and directly contacting the first and second floating gate electrodes; and
- a multiple layer structure which is sandwiched between the control gate electrode and the second floating gate electrode, the multiple layer structure including alternatively formed conductive layers and third insulating films.

13. A nonvolatile memory having a first floating gate electrode, a control gate electrode, a tunnel oxide film between the first floating gate electrode and a semiconductor substrate, and a first insulating film sandwiched between and directly contacting the control gate electrode and the first floating gate electrode, comprising:
- a second floating gate electrode which is sandwiched between the control gate electrode and the first floating gate electrode;
- a first multiple layer structure which is sandwiched between and directly contacting the first and second floating gate electrodes, the first multiple layer structure including alternatively formed first conductive layers and second insulating films; and
- a second multiple layer structure which is sandwiched between the control gate electrode and the second floating gate electrode, the second multiple layer structure including alternatively formed second conductive layers and third insulating films.

14. A nonvolatile memory having a floating gate electrode, a control gate electrode, a tunnel oxide film between the floating gate electrode and a semiconductor substrate, and a first insulating film sandwiched between and directly contacting the control gate electrode and the floating gate electrode, comprising:
- a multiple layer structure sandwiched between and directly contacting the control gate electrode and the floating gate electrode,
- the multiple layer structure including second and third insulating films which are alternatively formed and which have different barrier heights, respectively.

15. A nonvolatile memory having a floating gate electrode, a control gate electrode, a tunnel oxide film between the floating gate electrode and a semiconductor substrate, and a first insulating film sandwiched between and directly contacting the control gate electrode and the floating gate electrode, comprising:

a first multiple layer structure which is sandwiched between and directly contacting the control gate electrode and the floating gate electrode:

the first multiple layer structure including second and third insulating films which are alternatively formed and which have different barrier heights, respectively; and a second multiple layer structure which is sandwiched between and directly contacting the control gate electrode and the floating gate electrode, the second multiple layer structure including fourth and fifth insulating films which are alternatively formed and which have different barrier heights, respectively.

16. The nonvolatile memory as claimed in claim 14, wherein the first insulating film and the multiple layer structure are respectively adjoining.

17. The nonvolatile memory as claimed in claim 15, wherein the first and second multiple layer structures are respectively adjoining with the first insulating film.

* * * * *